United States Patent
Lee et al.

(10) Patent No.: US 10,345,944 B2
(45) Date of Patent: Jul. 9, 2019

(54) DISPLAY DEVICE INCLUDING TOUCH SENSOR AND MANUFACTURING METHOD THEREOF

(71) Applicant: SAMSUNG DISPLAY CO., LTD., Yongin-si, Gyeonggi-do (KR)

(72) Inventors: Kang Won Lee, Yongin-si (KR); Byeong Kyu Jeon, Yongin-si (KR); Jeong Heon Lee, Yongin-si (KR); Young Sik Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/991,174

(22) Filed: May 29, 2018

(65) Prior Publication Data

US 2018/0275808 A1   Sep. 27, 2018

Related U.S. Application Data

(63) Continuation of application No. 14/749,312, filed on Jun. 24, 2015, now Pat. No. 9,983,711.

(30) Foreign Application Priority Data

Nov. 26, 2014   (KR) .......................... 10-2014-0166442

(51) Int. Cl.
  *G06F 3/041* (2006.01)
  *G06F 3/044* (2006.01)
  *H05K 3/46* (2006.01)

(52) U.S. Cl.
  CPC ............ *G06F 3/0412* (2013.01); *G06F 3/044* (2013.01); *G06F 2203/04103* (2013.01); *G06F 2203/04111* (2013.01); *H05K 3/4685* (2013.01); *H05K 2201/10128* (2013.01); *H05K 2201/10151* (2013.01)

(58) Field of Classification Search
  None
  See application file for complete search history.

(56) References Cited

U.S. PATENT DOCUMENTS

| 9,207,482 | B2 | 12/2015 | Nashiki et al. |
| 9,400,576 | B2 * | 7/2016 | Chen ..................... G06F 1/1601 |
| 9,547,395 | B2 | 1/2017 | Bell |
| 2016/0077624 | A1 | 3/2016 | Zhao et al. |

FOREIGN PATENT DOCUMENTS

| CN | 103748538 A | 4/2014 |
| KR | 10-2007-0054917 A | 5/2007 |
| KR | 10-2012-0065686 A | 6/2012 |
| KR | 10-1258258 | 4/2013 |
| KR | 10-2013-0124882 A | 11/2013 |
| KR | 10-1337264 | 11/2013 |

(Continued)

*Primary Examiner* — Kenneth B Lee, Jr.
(74) *Attorney, Agent, or Firm* — Lee & Morse, P.C.

(57) ABSTRACT

A display device includes a display panel including a plurality of pixels, a touch sensor unit provided on the display panel, and including a touch sensing area in which a touch sensor is provided and a non-sensing area around the touch sensing area, and a polarizer provided on the touch sensor unit and bonded to the touch sensor unit, an edge side of the polarizer and an edge side of the touch sensor unit being aligned.

11 Claims, 22 Drawing Sheets

(56) References Cited

FOREIGN PATENT DOCUMENTS

| | | |
|---|---|---|
| KR | 10-2013-0142405 A | 12/2013 |
| KR | 10-1381817 | 3/2014 |
| KR | 10-2014-0043686 A | 4/2014 |
| TW | 200846991 A | 12/2008 |
| TW | 201344543 A | 11/2013 |
| TW | 201346677 A | 11/2013 |
| TW | 201348803 A | 12/2013 |
| TW | M488053 U | 10/2014 |

* cited by examiner

DISPLAY DEVICE INCLUDING TOUCH SENSOR AND MANUFACTURING METHOD THEREOF

CROSS-REFERENCE TO RELATED APPLICATIONS

This is a continuation application based on pending application Ser. No. 14/749,312, filed Jun. 24, 2015, the entire contents of which is hereby incorporated by reference.

Korean Patent Application No. 10-2014-0166442, filed on Nov. 26, 2014, in the Korean Intellectual Property Office, and entitled: "Display Device Including Touch Sensor and Manufacturing Method Thereof," is incorporated by reference herein in its entirety.

BACKGROUND

1. Field

Embodiments relate to a display device including a touch sensor and a manufacturing method thereof.

2. Description of the Related Art

A display device, such as a liquid crystal display (LCD), an organic light emitting diode (OLED) display, and an electrophoretic display, includes an electric field generating electrode and an electro-optical active layer. For example, the organic light emitting device includes an organic emission layer as the electro-optical active layer. The field generating electrode is connected to a switch such as a thin film transistor to receive a data signal, and the electro-optical active layer converts the data signal to an optical signal to display an image.

The above information disclosed in this Background section is only for enhancement of understanding of the background of the invention and therefore it may contain information that does not form the prior art that is already known in this country to a person of ordinary skill in the art.

SUMMARY

Embodiments are directed to a display device, including a display panel including a plurality of pixels, a touch sensor unit provided on the display panel, and including a touch sensing area in which a touch sensor is provided and a non-sensing area around the touch sensing area, and a polarizer provided on the touch sensor unit and bonded to the touch sensor unit, an edge side of the polarizer and an edge side of the touch sensor unit being aligned.

An edge side of the polarizer and an edge side of the touch sensor unit may be provided inside an edge side of the display panel.

The light blocking member may cover the edge of the display panel.

A touch wire connected to the touch sensor may be provided in the non-sensing area, and an internal edge of the non-sensing area may be aligned with an internal edge of the light blocking member or is provided inside the internal edge of the light blocking member.

A touch substrate included in the touch sensor unit may include at least one of a cyclic olefin polymer (COP) film, a non-elongation polycarbonate (PC) film, and a triacetyl cellulose (TAC) film.

The polarizer may include a circular polarizer.

An end of the touch wire may form a pad, and the polarizer may include a compressor hole exposing the pad.

The display device may further include a touch driver connected to the touch sensor unit and separated from an edge side of the polarizer by greater than a predetermined distance.

A plurality of touch electrodes may be provided in the touch sensing area, the plurality of touch electrodes may include a plurality of first touch electrodes and a plurality of second touch electrodes that are separated from each other, do not overlap each other, and are alternately disposed, the first touch electrodes may be arranged in a first direction and may be connected to each other by a plurality of first connectors, and the second touch electrodes may be arranged in a second direction that is different from the first direction and may be connected to each other by a plurality of second connectors.

The display device may further include an insulating layer provided between the first connector and the second connector and insulating the first connector from the second connector.

The first connector may be provided at a same layer as the first touch electrode and may be integrated with the first touch electrode, and the second connector may be provided at a different layer from the second touch electrode.

A plurality of touch electrodes may be provided in the touch sensing area, and the plurality of touch electrodes may be provided between a touch substrate and the polarizer.

A plurality of touch electrodes may be provided in the touch sensing area, and the plurality of touch electrodes may be provided between a touch substrate and the display panel.

Embodiments are also directed to a display device, including a display panel including a plurality of pixels, a touch sensor unit provided on the display panel, and including a touch sensing area in which a touch sensor is provided and a non-sensing area around the touch sensing area, a touch wire connected to the touch sensor being provided in the non-sensing area, and a polarizer provided on the touch sensor unit and bonded to the touch sensor unit, an internal edge side of the non-sensing area being aligned with an internal edge side of the light blocking member or being provided inside the internal edge of the light blocking member.

An edge side of the polarizer and an edge side of the touch sensor unit may be provided inside an edge side of the display panel.

A touch substrate included in the touch sensor unit may include at least one of a cyclic olefin polymer (COP) film, a non-elongation polycarbonate (PC) film, and a triacetyl cellulose (TAC) film.

The polarizer may include a circular polarizer.

Embodiments are also directed to a method for manufacturing a display device, the method including providing a base substrate on which a touch sensor is formed, forming a plurality of compressor holes in a base polarizer, bonding the base substrate and the base polarizer, cutting the base substrate and the base polarizer by a unit of a cell and forming a plurality of touch sensor units and a plurality of polarizers that are bonded, and compressing a touch driver on the touch sensor unit through the compressor hole.

The providing of a base substrate on which the touch sensor is formed may include forming a plurality of touch electrodes and a plurality of touch wires on a mother substrate, and cutting the mother substrate by a unit of the base substrate.

Compressor holes arranged in a direction from among the plurality of compressor holes may be connected to each other.

The compressor holes may be separated from each other.

The touch driver may be separated from an edge side of the polarizer by greater than a predetermined distance.

The base substrate may include at least one of a cyclic olefin polymer (COP) film, a non-elongation poly carbonate (PC) film, and a triacetyl cellulose (TAC) film.

The polarizer may include a circular polarizer.

BRIEF DESCRIPTION OF THE DRAWINGS

Features will become apparent to those of skill in the art by describing in detail example embodiments with reference to the attached drawings in which.

DETAILED DESCRIPTION

Figure 1:
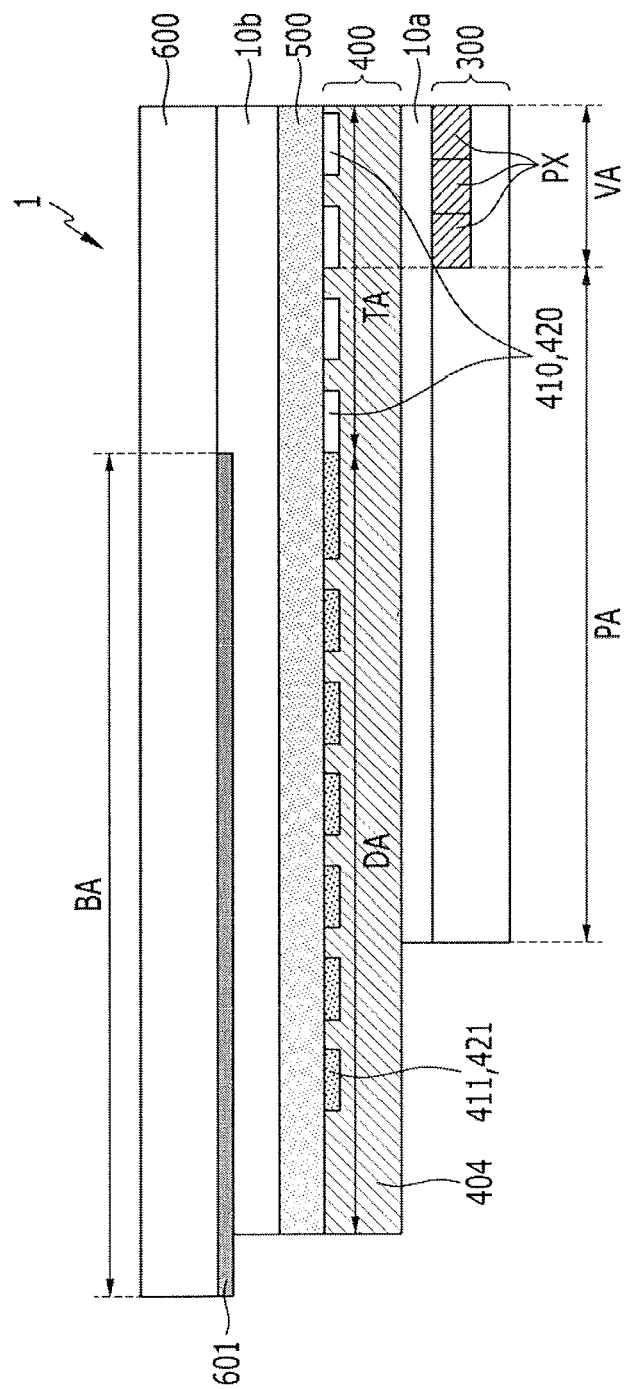
FIG. 1 illustrates a cross-sectional view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawings, the thickness of layers, films, panels, areas, etc., are exaggerated for clarity. Like reference numerals designate like elements throughout the specification. It will be understood that when an element such as a layer, film, area, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A display device according to an example embodiment will now be described with reference to FIG. 1 to FIG. 4.

Referring to FIG. 1, the display device 1 includes a display panel 300, a touch sensor unit 400, a polarizer 500, and a cover window 600.

The display panel 300 includes a display area (VA) for displaying an image and a peripheral area (PA) provided around the display area (VA). In the example embodiment shown in FIG. 1, the display panel 300 may display the image upward.

In the display area (VA), a plurality of pixels PX and a plurality of display signal lines connected to the pixels PX and transmitting a driving signal are provided.

The display signal lines include a plurality of gate signal lines for transmitting a gate signal and a plurality of data lines for transmitting a data signal. The gate signal lines and the data lines may cross each other and be extended. The display signal line may be extended to a peripheral area (PA) to form a pad.

A plurality of pixels PX may be arranged in, for example, substantially a matrix form. Each pixel PX may include at least one switching element connected to the gate line and the data line and at least one pixel electrode connected thereto. The switching element may be a three-terminal element such as a thin film transistor integrated on the display panel 300. The switching element is turned on or turned off according to the gate signal transmitted by the gate line to transmit the data signal transmitted by the data line to the pixel electrode. The pixel PX may further include an opposed electrode facing the pixel electrode. The opposed electrode may transmit a common voltage. The pixel PX may display an image with desired luminance according to the data voltage applied to the pixel electrode.

In the case of the organic light emitting device, an emission layer may be provided between the pixel electrode and the opposed electrode to form a light-emitting device.

In order to implement color display, each pixel may display one of primary colors, and a desired color may be recognized by combining the primary colors. An example of the primary colors may include three primary colors or four primary colors such as red, green, blue, and the like. Each pixel may further include a color filter positioned at a place corresponding to each pixel electrode and expressing one of the primary colors, and the emission layer included in the light emitting element may emit colored light.

The touch sensor unit 400 is provided on the display panel 300.

The touch sensor unit 400 may be attached to the display panel 300 by using an adhesive 10a such as an optically clear adhesive (OCA), an optically clear resin (OCR), or a pressure sensitive adhesive (PSA).

The touch sensor unit 400 may sense a contact induced by a foreign object. In this instance, the contact includes a case in which an external object such as a user's finger directly touches an upper side of the display device 1, and a hovering touch that represents a case in which the external object approaches the display device 1 or it moves after it has approached it.

The touch sensor unit 400 includes a touch substrate 404 and at least one touch electrode layer formed thereon.

The touch sensor unit 400 includes a touch sensing area (TA) for sensing a contact caused by the foreign object and a non-sensing area (DA) provided outside the same. The non-sensing area (DA) is also called a dead space.

The touch substrate 404 may be a flexible film, and without being restricted to this, it may be a rigid substrate including glass or plastic. The touch substrate 404 is an isotropic substrate and its phase delay value may be substantially 0 or very low. The touch substrate 404 may include, for example, at least one of a cyclic olefin polymer (COP) film, a non-elongation polycarbonate (PC) film, and a triacetyl cellulose (TAC) film that are isotropic films.

The touch electrode layer includes a plurality of touch electrodes 410 and 420 and a plurality of touch wires 411 and 421 connected thereto. The touch electrodes 410 and 420 are mainly provided in the touch sensing area (TA), and the touch wires 411 and 421 may be provided in the touch sensing area (TA) or the non-sensing area (DA).

The touch electrodes 410 and 420 may have predetermined transmittance so that the light provided by the display panel 300 may pass through them. For example, the touch electrodes 410 and 420 may include at least one of a conductive polymer, a transparent conductive material, etc. For example, an indium tin oxide (ITO), an indium zinc oxide (IZO), a metal nanowire, a PEDOT (poly(3,4-ethylenedioxythiophene)), a metal mesh, carbon nanotubes (CNT), or a thin metal layer may be used alone or in combination.

The touch wires 411 and 421 may include a transparent conductive material included in the touch electrodes 410 and 420 and/or a low-resistance material such as molybdenum (Mo), silver (Ag), titanium (Ti), copper (Cu), or aluminum (Al), or molybdenum/aluminum/molybdenum (Mo/Al/Mo).

The touch wires 411 and 412 may or may not include a portion that is provided at a same layer as the touch electrodes 410 and 420.

The touch electrodes 410 and 420 form a touch sensor for sensing the contact in various ways. The touch sensor may use various schemes including a resistive type, a capacitive type, an electro-magnetic (EM) type, and an optical type. A capacitive touch sensor will be exemplified in the present example embodiment, but other touch sensors may be used.

Regarding the capacitive touch sensor, one of the touch electrodes 410 and 420 receives a sensing input signal from the touch driver, generates a sensing output signal that is variable by the contact of the foreign object, and transmits the same to the touch driver.

In the case in which the touch electrodes 410 and 420 form a self-sensing capacitor with the foreign object, when the touch electrodes 410 and 420 receive a sensing input signal, they are stored with a predetermined amount of charges, and when a contact caused by a foreign object such as a finger is generated, the amount of charges stored in the self-sensing capacitor is changed and a sensing output signal that is different from the input sensing input signal may be output. Contact information such as contact state or contact position may be acquired through the change of the sensing output signal.

When the neighboring touch electrodes 410 and 420 form a mutual-sensing capacitor, one of the touch electrodes 410 and 420 receives a sensing input signal from the touch driver and the mutual sensing capacitor is charged with a predetermined amount of charges. When there is a contact induced by the foreign object such as the finger, the amount of charges stored in the mutual sensing capacitor is changed and the changed amount of charges is output to be a sensing output signal through the remaining touch electrodes 410 and 420. The contact information such as contact state or contact position may be found through the sensing output signal.

The present example embodiment will is described using a touch sensor forming a mutual sensing capacitor as an example.

Figure 2:
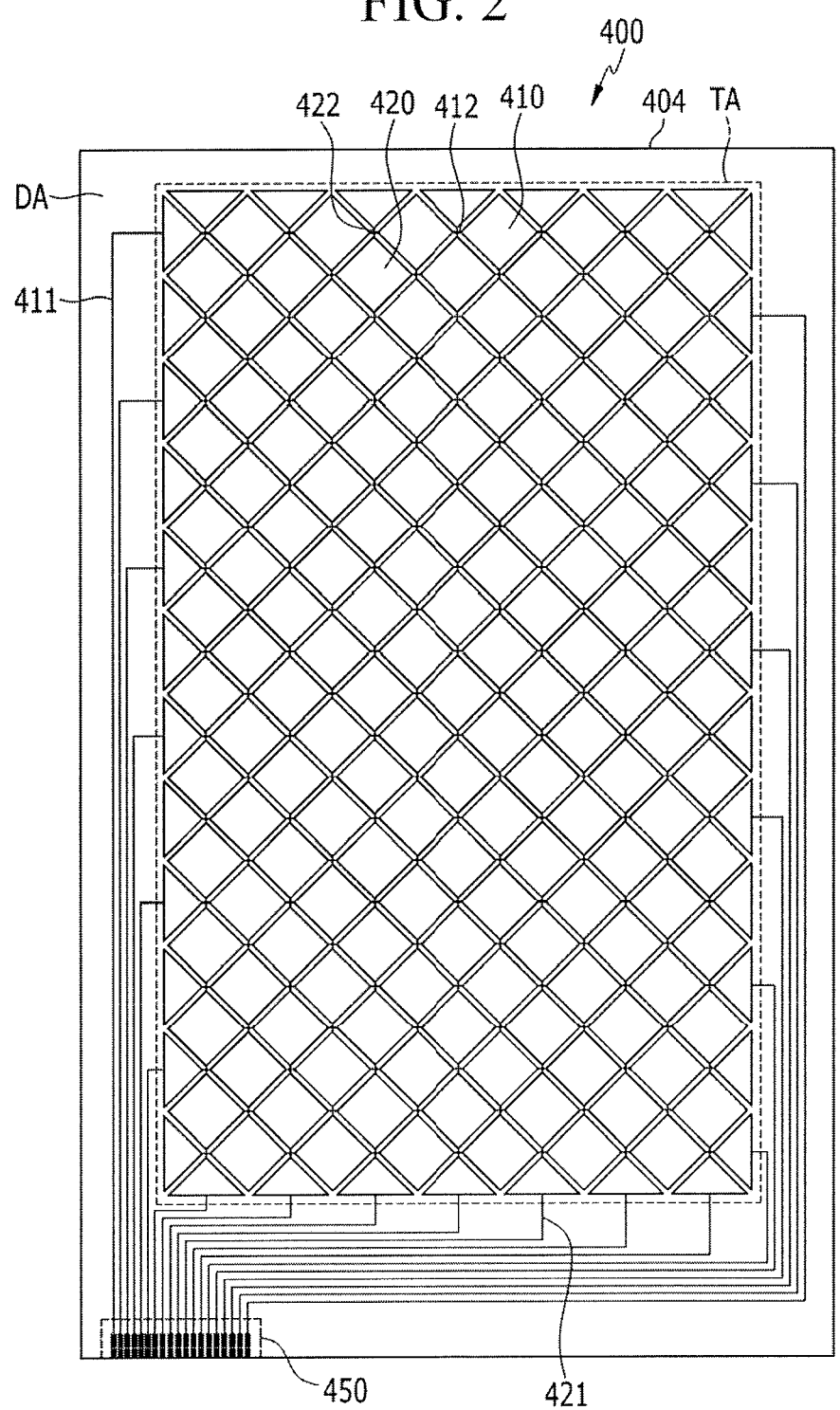
FIG. 2 illustrates a top plan view of a touch sensor of a display device according to an example embodiment.

Referring to FIG. 2, touch electrodes 410 and 420 of a touch sensor according to an example embodiment may include a plurality of first touch electrodes 410 and a plurality of second touch electrodes 420. The first touch electrodes 410 are separated from the second touch electrodes 420.

The first touch electrodes 410 and the second touch electrodes 420 may be alternately disposed so that they may not overlap each other in the touch sensing area (TA). The first touch electrodes 410 may be disposed in a column direction and a row direction, and the second touch electrodes 420 may be disposed in the column direction and the row direction.

The first touch electrodes 410 and the second touch electrodes 420 may be provided at the same layer, and without being restricted to this, the first touch electrodes 410 and the second touch electrodes 420 may be provided at different layers from each other. When the first touch electrodes 410 and the second touch electrodes 420 are provided at the different layers, the first touch electrodes 410 and the second touch electrodes 420 may be provided on different sides of the touch substrate 404 or at different layers on a same side of the touch substrate 404.

The first touch electrodes 410 and the second touch electrodes 420 may be quadrangular, and without being restricted to this, they may have various types of forms such as protrusions for the purpose of improving sensitivity of the touch sensor.

The first touch electrodes 410 that are arranged on the same row or column may be connected to or separated from each other in or out of the touch sensing area (TA). In a like manner, at least a part of the second touch electrodes 420 that are arranged on the same row or column may be connected to or separated from each other in or out of the touch sensing area (TA). For example, as shown in FIG. 2, when the first touch electrodes 410 disposed on the same row are connected to each other in the touch sensing area (TA), the second touch electrodes 420 disposed on the same column may be connected to each other in the touch sensing area (TA). In detail, the first touch electrodes 410 provided on the respective rows may be connected to each other through a first connector 412, and the second touch electrodes 420 provided on the respective columns may be connected to each other through a second connector 422.

Figure 3:
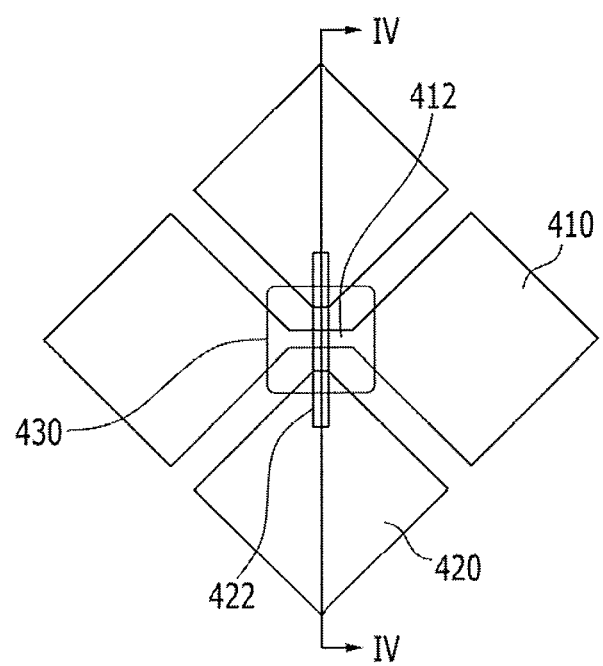
FIG. 3 illustrates an enlarged view of part of a touch sensor included in a touch sensor unit according to an example embodiment.
Figure 4:
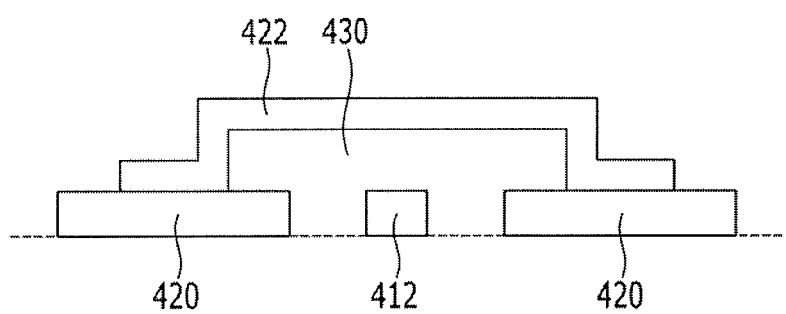
FIG. 4 illustrates a cross-sectional view of a touch sensor of FIG. 3 with respect to a line IV-IV.

Referring to FIG. 3 and FIG. 4, the first connector 412 for connecting the neighboring first touch electrodes 410 may be provided at the same layer as the first touch electrode 410, and may be formed with the same material as the first touch electrode 410. Thus, the first touch electrodes 410 and the first connector 412 may be integrated and may be simultaneously patterned.

The second connector 422 for connecting the neighboring second touch electrodes 420 may be provided at the different layer from the second touch electrode 420. Thus, the second touch electrodes 420 and the first connector 412 may be separated from each other and may be individually patterned. The second touch electrodes 420 and the second connector 422 may be connected to each other through a direct contact.

An insulating layer 430 is provided between the first connector 412 and the second connector 422 to insulate the first connector 412 from the second connector 422. As shown in FIG. 3 and FIG. 4, the insulating layer 430 may be a plurality of independent island-type insulators that are disposed at respective crossing points of the first connector 412 and the second connector 422. The insulating layer 430 may expose at least a part of the second touch electrode 420 so that the second connector 422 may be connected to the second touch electrode 420.

According to another example embodiment, the insulating layer 430 may be formed on the touch substrate 404, and the insulating layer 430 provided on part of the second touch electrode 420 may be removed for a connection of the second touch electrode 420 neighboring in the column direction.

Differing from FIG. 3 and FIG. 4, the second connector 422 for connecting the neighboring second touch electrodes 420 is provided at the same layer as the first touch electrode 410 and is integrated with the first touch electrode 410, and the first connector 412 for connecting the neighboring first touch electrodes 410 may be provided on the layer that is different from that of the first touch electrode 410.

Referring to FIG. 2, the first touch electrodes 410 of the respective rows, connected to each other, are connected to a touch driver through the first touch wire 411, and the second touch electrodes 420 of the respective columns, connected to each other, are connected to the touch driver through the second touch wire 421. The first touch wire 411 and the second touch wire 421 may be provided in the non-sensing area (DA) or the touch sensing area (TA).

Ends of the first touch wire 411 and the second touch wire 421 may form a pad 450 in the non-sensing area (DA) of the touch sensor unit 400.

The first touch wire 411 may provide a sensing input signal to the first touch electrode 410 or may output a sensing output signal to the touch driver through the pad 450. The second touch wire 421 may provide a sensing input signal to the second touch electrode 420 or may output a sensing output signal to the touch driver through the pad 450.

The touch driver controls an operation of the touch sensor. The touch driver may transmit the sensing input signal to the touch sensor or may receive the sensing output signal and process the same. The touch driver process the sensing output signal to generate touch information such as a touch state and a touch position.

The touch driver may be mounted as at least one IC chip directly to the touch sensor unit 400, may be installed on a flexible printed circuit film (FPC) or a printed circuit board and be attached as a tape carrier package (TCP) to the touch sensor unit 400, or may be installed on an additional printed circuit board and be connected to the pad 450. Differing from this, the touch driver may be integrated on the touch sensor unit 400.

The first touch electrode 410 and the second touch electrode 420 neighboring each other may form a mutual sensing capacitor functioning as a touch sensor. The mutual sensing capacitor may receive a sensing input signal through one of the first touch electrode 410 and the second touch electrode 420, and may output a change of an amount of charges caused by a contact of the foreign object as a sensing output signal through the other touch electrode.

Differing from FIG. 2 to FIG. 4, a plurality of first touch electrodes 410 and a plurality of second touch electrodes 420 may be separated from each other, and may be connected to the touch driver through a touch wire, respectively. In this case, the respective touch electrodes 410 and 420 may form self-sensing capacitors as touch sensors. The self-sensing capacitor may receive a sensing input signal and be charged with a predetermined amount of charges, and when a contact is generated by a foreign object such as a finger, it may output the sensing input signal that is input because of the change of the amount of stored charges and another sensing output signal.

As described, the touch electrodes 410 and 420 provided at the same layer on the touch substrate 404 are formed thereby reducing the thickness of the touch sensor unit 400 and also reducing the thickness of the display device 1 including the touch sensor unit 400. Accordingly, flexibility of the flexible display device 1 that may be bent, folded, or rolled may be further increased, and the thickness of the touch sensor unit 400 is reduced to improve optical characteristics such as transmittance of images displayed by the display device 1 including a touch sensor. Further, flexibility of the display device 1 may be increased.

Referring to FIG. 1, a boundary of the touch sensing area (TA) and the non-sensing area (DA) of the touch sensor unit 400 may be provided to correspond to the peripheral area (PA) of the display panel 300 or may be provided to correspond to the boundary between the peripheral area (PA) and the display area (VA). Thus, an edge side of the touch sensing area (TA) may be aligned with an edge side of the display area (VA) or may be provided on an external side thereof. An external edge side of the non-sensing area (DA) may be provided, for example, outside an external edge side of the peripheral area (PA) of the display panel 300.

The touch wire 411 or 421 that is nearest the touch sensing area (TA) from among the touch wires 411 and 421 provided in the non-sensing area (DA) of the touch sensor unit 400 may be electrically and physically connected to one of the touch electrodes 410 and 420. According to an example embodiment, an internal edge side of the touch wire 411 or 421 that is close to the touch sensing area (TA) may correspond to the boundary between the touch sensing area (TA) and the non-sensing area (DA).

A polarizer 500 is provided on the touch sensor unit 400. The polarizer 500 may be provided on the touch sensor unit 400 through an adhesive such as OCA, OCR, or PSA. Therefore, a touch electrode layer of the touch sensor unit 400 may be provided between the polarizer 500 and the touch substrate 404.

The polarizer 500 may be a flexible film. The polarizer 500 may include polyvinyl alcohol (PVA), and at least one support member may be attached to respective sides of the polarizer 500. The support member may include triacetyl cellulose (TAC), cellulous acetate propionate (CAP), and wide view-TAC (WV-TAC). An adhesive may be formed on one side of the polarizer 500.

The polarizer 500 may prevent external light that is reflected from electrodes or wires included in the display panel 300 and the touch sensor unit 400 from being viewed. Thus, the light that is input into the display device 1 from the outside is passed through the polarizer 500, is reflected from an electrode or a wire provided below the same, and is input to the polarizer 500 and generates destructive interference with the light that is input to the polarizer 500 from the outside, and it may not be visible from the outside.

The polarizer 500 may be a circular polarizer, and in this case it may include a linear polarizer and a quarter-wave plate.

The polarizer 500 is provided to an observer and the touch sensor unit 400 is attached below the same according to an example embodiment so the light reflected from the pattern such as the touch electrode or the touch wire of the touch sensor unit 400 is not viewable by the outside observer.

The polarizer 500 may include a compressor hole for exposing the pad 450 of the touch sensor unit 400.

A cover window 600 may be further provided on the polarizer 500. The cover window 600 made be made of an insulating material such as plastic or glass. The cover window 600 may be flexible or rigid. A surface of the cover window 600 may be a touch side of the display device 1 to be contacted by the foreign object.

The cover window 600 may be attached to the polarizer 500 by using an adhesive 10b such as OCA, OCR, or PSA.

A light blocking member 601 may be provided on an edge on a bottom side of the cover window 600. The light blocking member 601 may expose the display area (VA) or the touch sensing area (TA) of the display panel 300, and may cover at least a part of the peripheral area (PA) and at least a part of the non-sensing area (DA) so that they may be invisible from the outside.

Referring to FIG. 1, an internal edge side of the blocking area (BA) in which the light blocking member 601 is formed is aligned with the boundary between the non-sensing area (DA) and the touch sensing area (TA) of the touch sensor unit 400, but is not restricted thereto. Thus, the internal edge side of the blocking area (BA) may be provided to a further internal side of the internal edge side of the non-sensing area (DA). In this case, the internal edge side of the blocking area (BA) may be provided in the touch sensing area (TA).

The polarizer 500 is provided to the side of the external observer and the touch sensor unit 400 is attached to the same so that the pattern such as the touch electrode or the touch wire of the touch sensor unit 400 is invisible to the external observer according to an example embodiment. Thus, there is no need for the light blocking member 601 to entirely cover the touch wires 411 and 412 of the touch sensor unit 400.

In a general device, a light blocking member may be formed to further internal sides of the internal edge sides of the touch wires so that the touch wires may not be visible from lateral sides. In contrast, according to an example embodiment, the touch wires 411 and 412 are invisible even when not covered by the light blocking member 601 so a width of the light blocking member 601 may be further reduced, and the non-sensing area (DA) in which the touch wires 411 and 412 are not formed and which is covered by the light blocking member 601 may be removed, thereby further reducing the width of the non-sensing area (DA).

Further, the position of the area in which the touch wires 411 and 412 are formed has no limits so the freedom of design may be increased. Thus, the internal edge side of the area in which the touch wires 411 and 412 are formed may be formed to digress from the blocking area (BA) and further approach the display area (VA). Accordingly, the bezel of the display device 1 may be made narrower to gain design competition.

According to an example embodiment, the edge side of the touch sensor unit 400 and the edge side of the polarizer 500 are aligned and correspond to each other one by one. For example, the touch sensor unit 400 and the polarizer 500 may be formed by bonding them together and cutting them together. Accordingly, a margin for the tolerance for bonding the touch sensor unit 400 and the polarizer 500 is not needed.

In the example embodiment shown in FIG. 1, the edge sides of the bonded touch sensor unit 400 and the polarizer 500 are provided on the further external side of the edge side of the display panel 300, and without being restricted to this, the tolerance for bonding the touch sensor unit 400 and the polarizer 500 is removed so the area of the non-sensing area (DA) of the touch sensor unit 400 may be reduced and the edge sides of the touch sensor unit 400 and the polarizer 500 may be provided to be on a further internal side of the edge side of the display panel 300. Thus, the touch sensor unit 400 and the polarizer 500 may be provided inside the edge side of the display panel 300. Accordingly, the blocking area (BA) of the cover window 600 may be further reduced so the bezel of the display device 1 may be further reduced.

The light blocking member 601 may cover the edge side of the display panel 300.

A display device according to an example embodiment will now be described with reference to FIG. 5 together with the above-described drawings.

Figure 5:
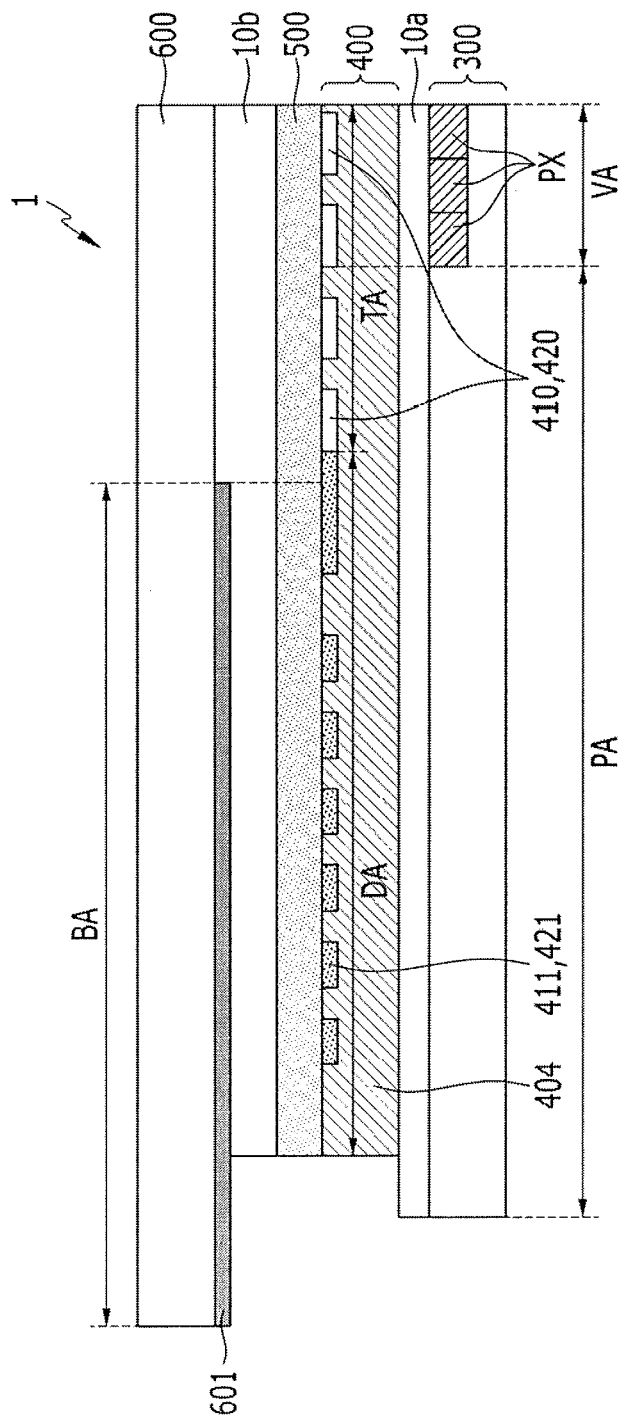
FIG. 5 illustrates a cross-sectional view of a display device according to an example embodiment.

Referring to FIG. 5, the display device 1 according to an example embodiment generally corresponds to the example embodiment described with reference to FIG. 1 to FIG. 4, and an area in which the touch wires 411 and 412 are formed may include an area (A) that is not covered by the light blocking member 601 but digresses from the blocking area (BA). Thus, part of the non-sensing area (DA) may digress from the blocking area (BA).

FIG. 5 illustrates a case in which the touch sensor unit 400 and the polarizer 500 are provided inside the edge side of the display panel 300. As described above, when the touch sensor unit 400 and the polarizer 500 are bonded with each other, are then cut together, and are formed in the process for manufacturing the display device 1, the tolerance for bonding the touch sensor unit 400 and the polarizer 500 is not needed and the area in which the touch wires 411 and 412 are formed may be reduced. Compared to the above-described example embodiment, when the touch wires 411 and 412 are formed with a finer pattern, the area of the non-sensing area (DA) may be further reduced.

Accordingly, the blocking area (BA) of the cover window 600 may be further reduced to further reduce the bezel of the display device 1.

A display device according to an example embodiment will now be described with reference to FIG. 6 together with the above-described drawings.

Figure 6:
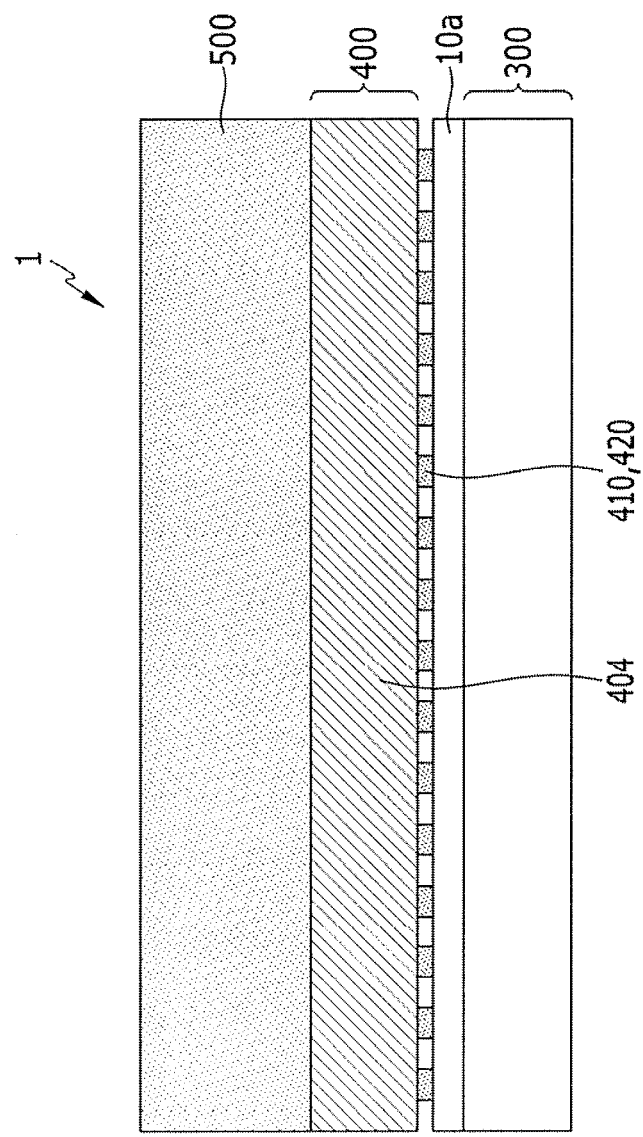
FIG. 6 illustrates a cross-sectional view of a display device according to an example embodiment.

Referring to FIG. 6, the display device 1 according to an example embodiment generally corresponds to the example embodiment described with reference to FIG. 1 to FIG. 4, and a configuration of the touch sensor unit 400 may be different. In detail, a touch electrode layer including touch electrodes 410 and 420 may be provided below a touch substrate 404 of the touch sensor unit 400. The touch electrode layer of the touch sensor unit 400 may be provided between the display panel 300 and the touch substrate 404.

According to the present example embodiment, compared to the above-described example embodiment, the positions of the touch electrodes 410 and 420 included in the touch electrode layer may be provided near the display panel 300, and the positions of the touch electrodes 410 and 420 may be provided near a neutral plane of the display device 1 when the neutral plane is provided downward with respect to the touch substrate 404. Here, the neutral plane may signify a position where a strain becomes substantially zero. Accordingly, deformation applied to the touch electrodes 410 and 420 when the flexible display device 1 is bent or folded may be reduced to reduce the fault such as cutting of the touch electrodes 410 and 420.

A method for manufacturing a display device 1 including a touch sensor according to an example embodiment will now be described with reference to FIG. 7 through FIG. 24 together with the above-described drawings.

Figure 7:
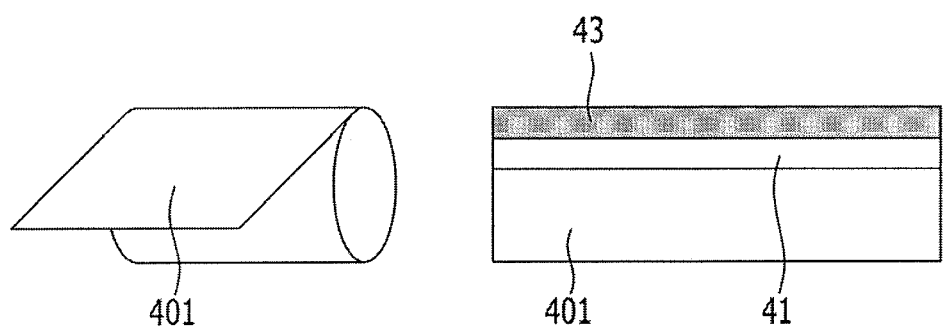
FIG. 7 illustrates a process for forming a conductive layer on a mother substrate in a process for manufacturing a touch sensor unit according to an example embodiment.

Referring to FIG. 7, a conductive layer is formed on a mother substrate 401 such as a cyclic olefin polymer (COP) film, a non-elongation polycarbonate (PC) film, or a triacetyl cellulose (TAC) film. The conductive layer may include a first conductive layer 41 and a second conductive layer 43 that are sequentially stacked, but is not limited thereto. In this case, the first conductive layer 41 may include a transparent conductive material such as ITO or IZO, and the second conductive layer 43 may include a metal material such as aluminum (Al).

Figure 8:
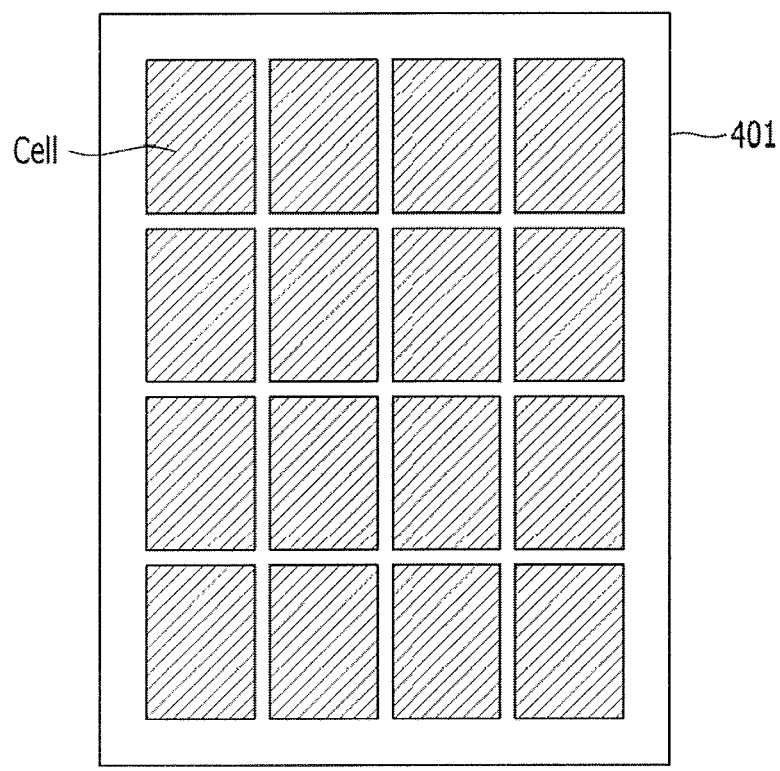
FIG. 8 illustrates a layout view of a plurality of cell areas on a mother substrate in a process for manufacturing a touch sensor unit according to an example embodiment.

Referring to FIG. 8, the mother substrate 401 on which the conductive layer is formed may include a plurality of cells. Each cell represents an area in which a touch sensor unit 400 to be included in a display device 1 is formed. A distance between neighboring cells on the mother substrate 401 may be, for example, about 2 mm to 3 mm.

Figure 9:
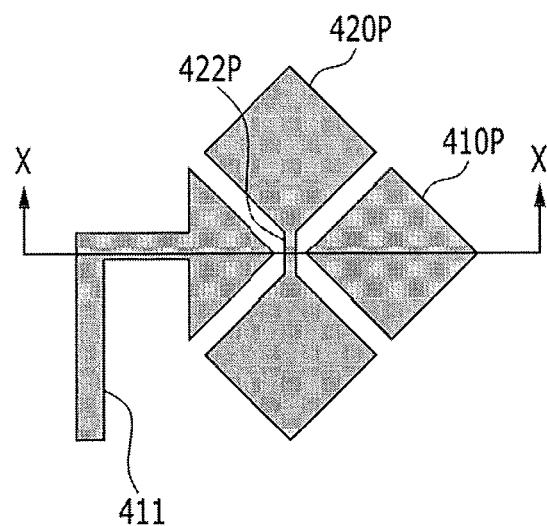
FIG. 9 illustrates a top plan view of a touch sensor in an intermediate process for manufacturing a touch sensor in a process for manufacturing a touch sensor unit according to an example embodiment.
Figure 10:
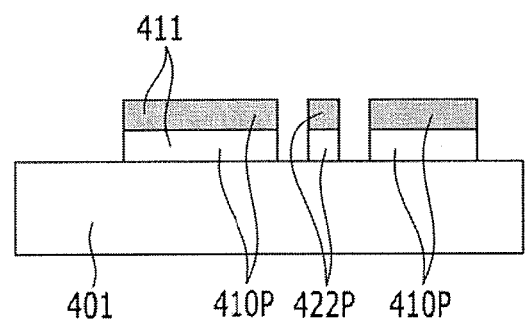
FIG. 10 illustrates a cross-sectional view of a touch sensor in an intermediate process shown in FIG. 9 with respect to a line X-X.

Referring to FIG. 9 and FIG. 10, the first conductive layer 41 and the second conductive layer 43 are patterned to form a first intermediate pattern 410P, a second intermediate pattern 420P, a second connection pattern 422P, and a first touch wire 411 and a second touch wire 421 connected to the first intermediate pattern 410P and the second intermediate pattern 420P. Forms of the first intermediate pattern 410P and the second intermediate pattern 420P may correspond to those of the above-described first touch electrode 410 and the second touch electrode 420.

The second intermediate pattern 420P provided on the same column is provided at the same layer as the second intermediate pattern 420P, and they may be connected to each other through the patterned second connection pattern 422P. Differing from this, the first intermediate pattern 410P provided on the same row may be connected thereto through an additional first connection pattern.

Figure 11:
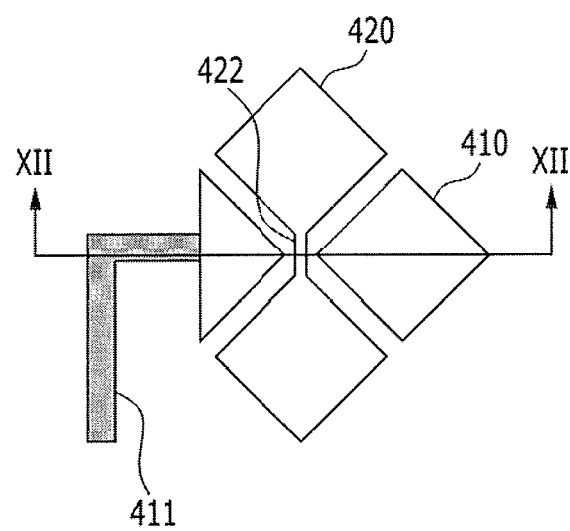
FIG. 11 illustrates a top plan view of a touch sensor in an intermediate process next to a process shown in FIG. 9 in a process for manufacturing a touch sensor unit according to an example embodiment.
Figure 12:
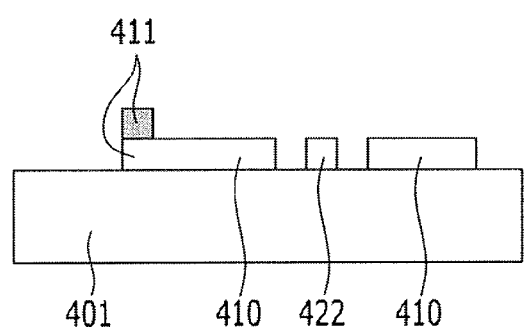
FIG. 12 illustrates a cross-sectional view of a touch sensor in an intermediate process of FIG. 11 with respect to a line XII-XII.

Referring to FIG. 11 and FIG. 12, the second conductive layer 43 that is an upper layer of the first intermediate pattern 410P, the second intermediate pattern 420P, and the second connection pattern 422P is removed through an etching method to form a plurality of transparent first touch electrodes 410, a plurality of second touch electrodes 420, and a plurality of second connectors 422. Differing from this, when the first touch electrode 410 arranged on the same column is connected to the first connector 412 provided at the same layer, the first connector 412 may be formed instead of the second connector 422.

The first touch wire 411 and the second touch wire 421 may include the first conductive layer 41 and the second conductive layer 43 to form a low-resistance wire.

Figure 13:
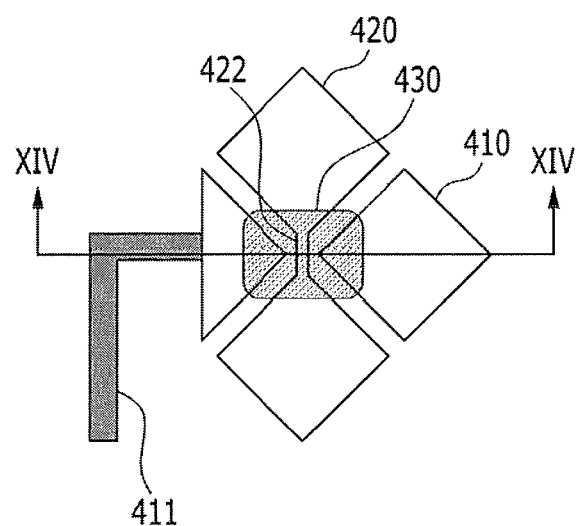
FIG. 13 illustrates a top plan view of a touch sensor in an intermediate process next to a process of FIG. 11 in a process for manufacturing a touch sensor unit according to an example embodiment.
Figure 14:
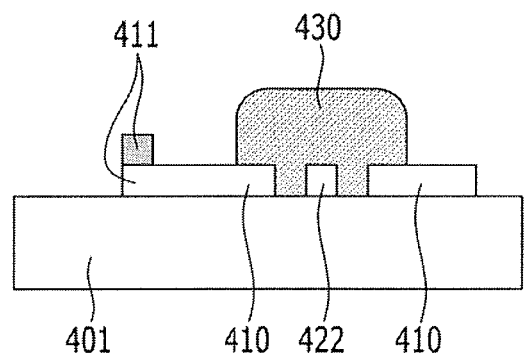
FIG. 14 illustrates a cross-sectional view of a touch sensor in an intermediate process of FIG. 13 with respect to a line XIV-XIV.

Referring to FIG. 13 and FIG. 14, an insulating material is stacked and patterned on the first touch electrode 410, the second touch electrode 420, the second connector 422, and the touch wire to form an insulating layer 430 provided on the second connector 422 and covering the second connector 422.

Figure 15:
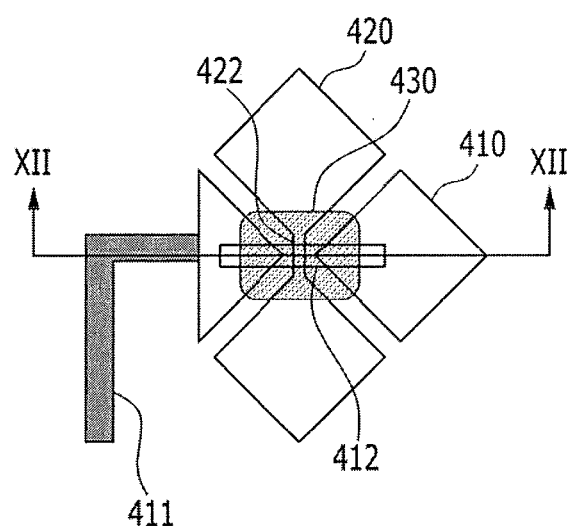
FIG. 15 illustrates a top plan view of a touch sensor in an intermediate process next to a process of FIG. 13 in a process for manufacturing a touch sensor unit according to an example embodiment.
Figure 16:
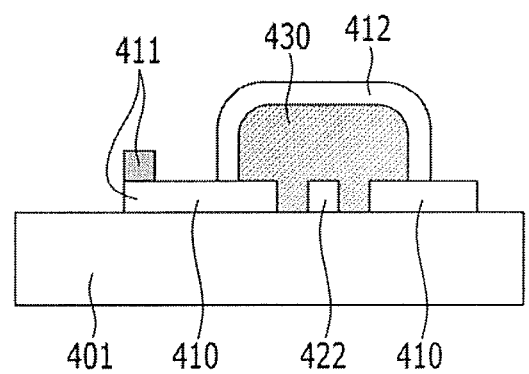
FIG. 16 illustrates a cross-sectional view of a touch sensor in an intermediate process of FIG. 15 with respect to a line XVI-XVI.

Referring to FIG. 15 and FIG. 16, a conductive material is stacked and patterned on the insulating layer 430 to form a first connector 412 crossing the second connector 422 in an insulated manner and connecting the first touch electrodes 410 neighboring on one row. Hence, a plurality of cells, including a plurality of touch sensors configured with the first touch electrode 410 and the second touch electrode 420, is provided on the mother substrate 401.

Figure 17:
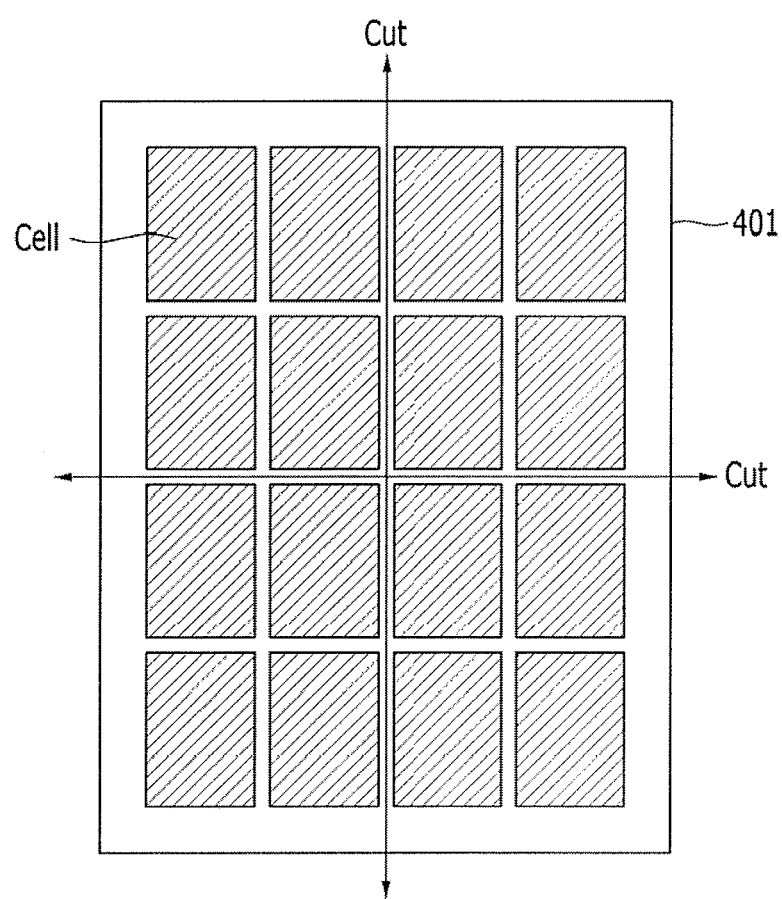
FIG. 17 illustrates a top plan view of a process for cutting a mother substrate on which a touch sensor is formed into a plurality of base substrates in a process for manufacturing a touch sensor unit according to an example embodiment.

Referring to FIG. 17, the mother substrate 401 on which a plurality of touch sensors is formed may be cut into a plurality of base substrates. For example, substantially four base substrates may be made out of one mother substrate 401. The tolerance at the time of cutting may be, for example ±0.3 mm. The respective base substrates that are cut may include a plurality of cells. Differing from the present example embodiment, the mother substrate 401 may not be cut depending on the size of the base polarizer to be attached.

Figure 18:
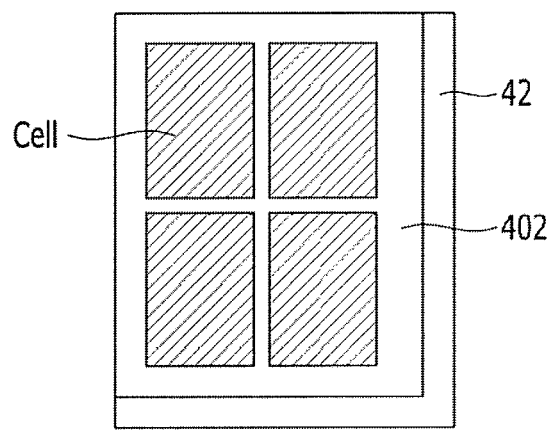
FIG. 18 illustrates that a protection film is attached to a rear side of a base substrate in a process for manufacturing a touch sensor unit according to an example embodiment.

Referring to FIG. 18, a protection film 42 may be attached to a rear side of a cut base substrate 402.

Figure 19:
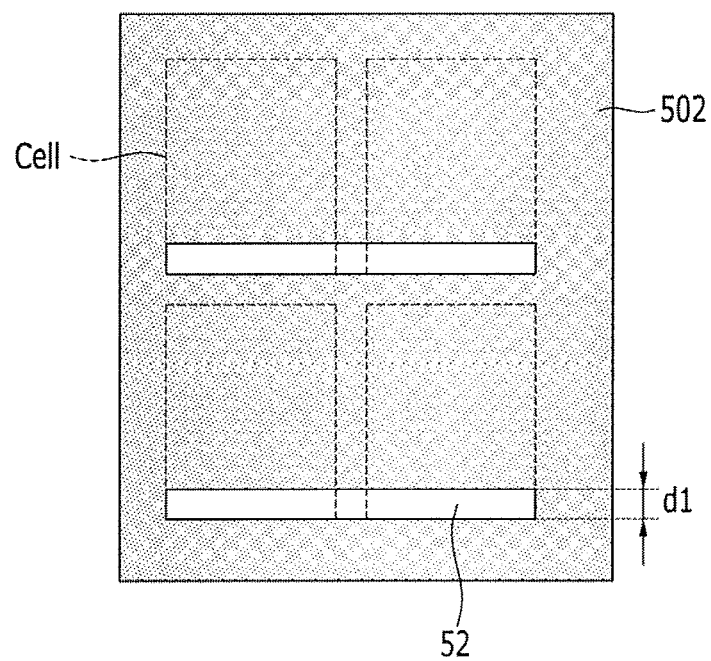
FIG. 19 illustrates a top plan view of a base polarizer according to an example embodiment.

Referring to FIG. 19, when a base polarizer 502 including a support member such as PVA and TAC is provided, at least one compressor hole 52 may be formed. A touch driver in a form of a flexible printed circuit film may be compressed through the compressor hole 52. A top-down width d1 of the compressor hole 52 may be greater than about 1 mm. The compressor holes 52 corresponding to the cells arranged in a horizontal direction may be connected to each other.

Figure 20:
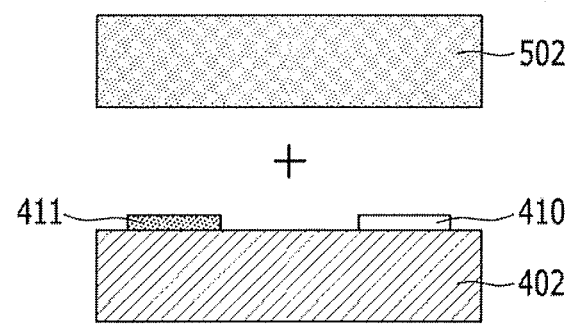
FIG. 20 illustrates a cross-sectional view of a process for bonding a base substrate on which a touch sensor according to an example embodiment is formed and a base polarizer.
Figure 21:
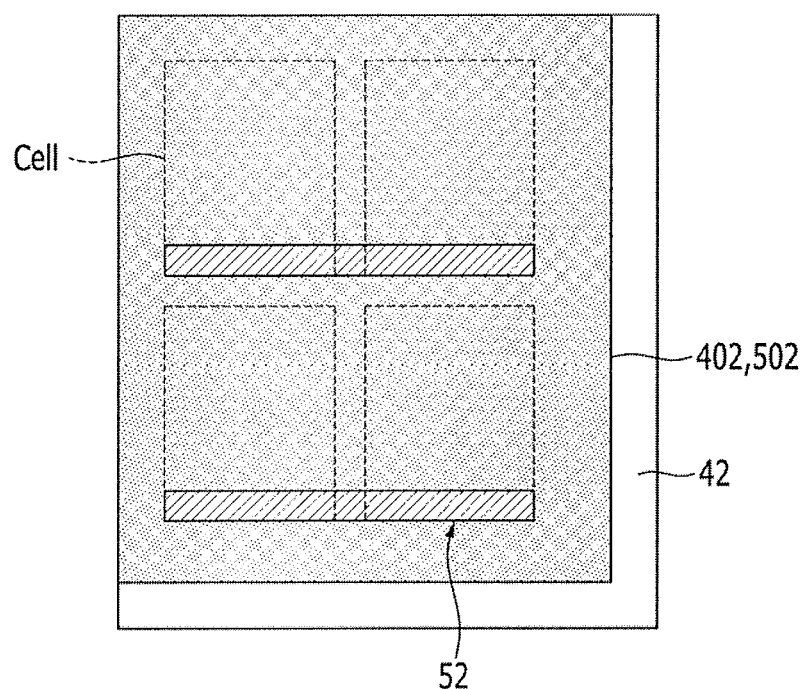
FIG. 21 illustrates a top plan view of a base substrate and a base polarizer that are bonded in a process of FIG. 20.

Referring to FIG. 20 and FIG. 21, the base substrate 402 on which the touch sensor is formed and the base polarizer 502 are bonded. In this instance, the base polarizer 502 and the base substrate 402 may be bonded through an adhesive formed on a lower side of the base polarizer 502. As described above, when the size of the base polarizer 502 corresponds to the mother substrate 401, the mother substrate 401 on which the touch sensor is formed and the base polarizer 502 may be bonded.

A touch electrode layer such as a touch electrode and a touch wire may be provided between the base polarizer 502 and the base substrate 402. However, differing from this, the touch electrode layer may be provided not between the base polarizer 502 and the base substrate 402 but on a lower side of the base substrate 402.

The compressor hole 52 of the base polarizer 502 may expose ends of the touch wires 411 and 421, that is, a pad.

The bonded base substrate 402 and the base polarizer 502 are cut into cells to manufacture the touch sensor unit 400 and the polarizer 500 bonded for each cell. Since the touch sensor unit 400 and the polarizer 500 are cut one by one while bonded together, a bonding tolerance may be reduced. Therefore, the area of the non-sensing area (DA) of the touch sensor unit 400 may be further reduced, and the bezel area of the display device 1 may be further reduced as described.

Figure 23:
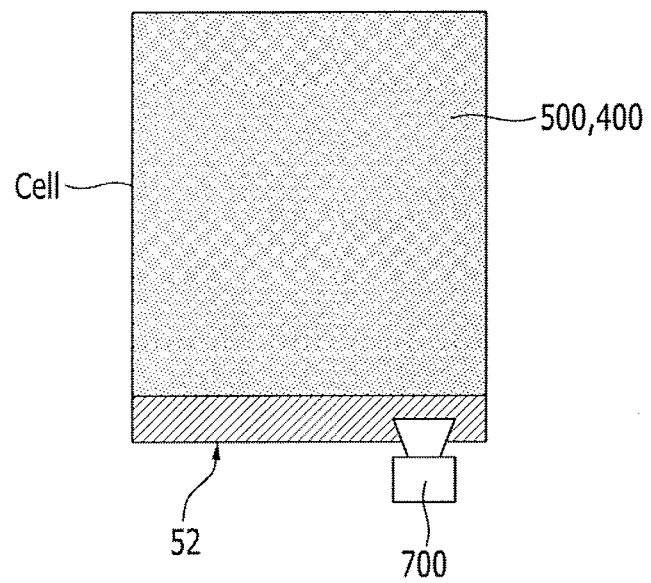
FIG. 23 illustrates a top plan view of a touch sensor unit on which a touch driver is compressed in FIG. 22.

One edge of the touch sensor unit 400 of each cell may be exposed by the compressor hole 52 of the polarizer 500, as shown in FIG. 23.

Figure 22:
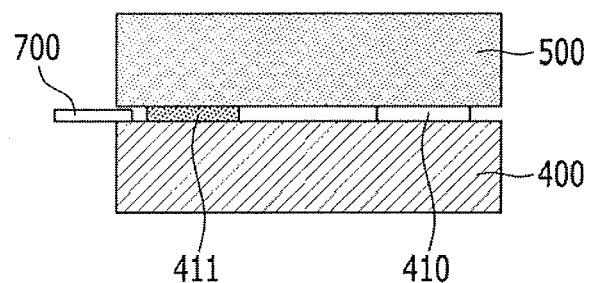
FIG. 22 illustrates a cross-sectional view for cutting a base polarizer and a base substrate that are bonded in FIG. 20 and FIG. 21 for respective cells and compressing a touch driver on a touch sensor unit.

Referring to FIG. 22 and FIG. 23, a touch driver 700 for driving the touch sensor is compressed on the touch sensor unit 400 through the compressor hole 52. To prevent the base polarizer 502 from being damaged by the heat when the touch driver 700 is compressed, a compression position of the touch driver 700 may be distanced from the end of the base polarizer 502 with a gap of about 1 mm to 1.5 mm, but is not limited thereto. For this purpose, the top-down width d1 of the compressor hole 52 of the base polarizer 502 is greater than the gap.

The touch driver 700 may be compressed as at least one IC chip on the touch sensor unit 400 or may be mounted on a flexible printed circuit film (FPC) and compressed as a TCP on the touch sensor unit 400. Differing from this, the touch driver 700 may be installed on an additional printed circuit board so that the printed circuit board may be connected to the touch sensor unit 400 through the compressor hole 52.

Figure 24:
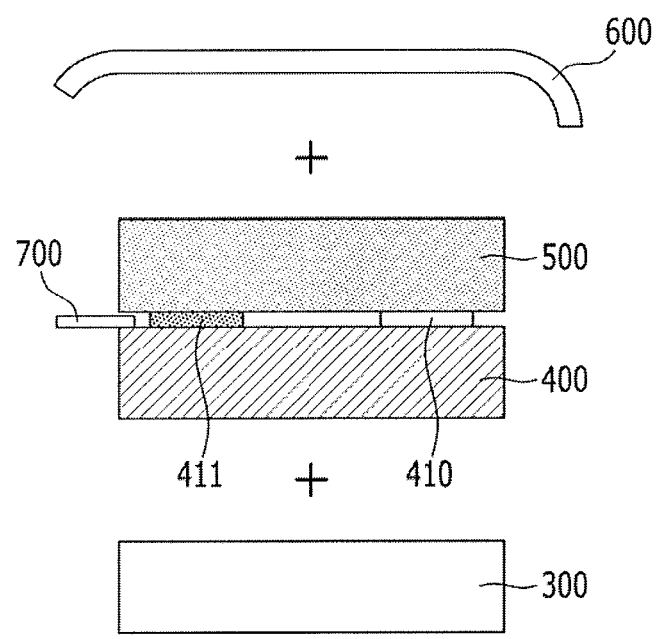
FIG. 24 illustrates a cross-sectional view for bonding a display panel and a cover window to a touch sensor unit shown in FIG. 22 and FIG. 23.

Referring to FIG. 24, the display panel 300 is bonded to a bottom of the touch sensor unit 400 and a cover window 600 is bonded to a top of the polarizer 500 to manufacture the display device 1 according to an example embodiment.

A method for manufacturing a display device according to an example embodiment will now be described with reference to FIG. 25 and FIG. 26 together with described FIG. 7 to FIG. 24

Like constituent elements as the described example embodiment will have like reference numerals and descriptions thereof may not be repeated.

Figure 25:
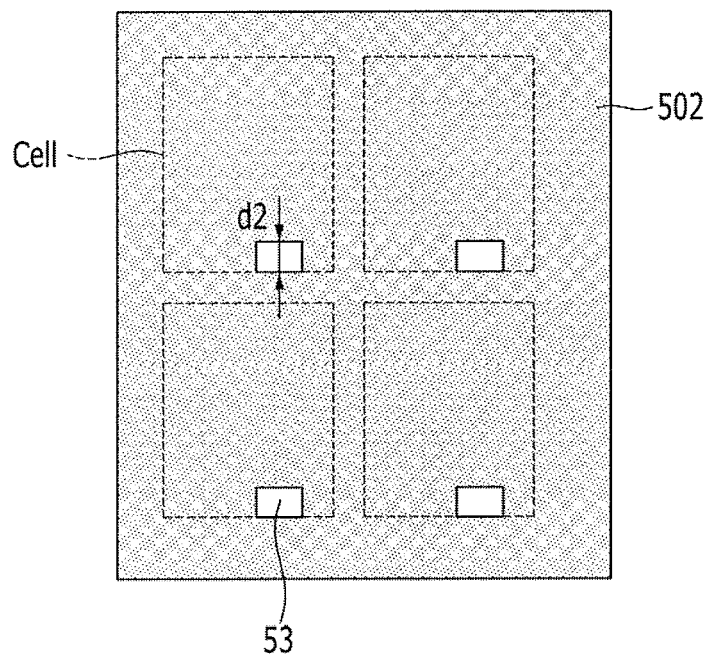
FIG. 25 illustrates a top plan view of a base polarizer according to an example embodiment.
Figure 26:
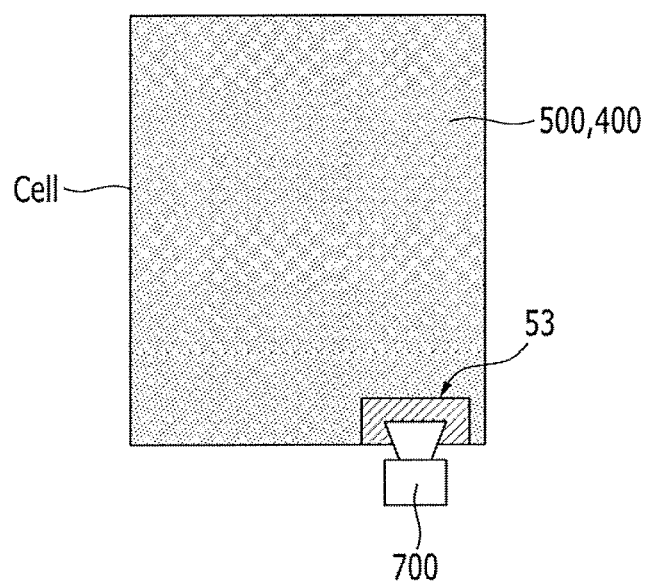
FIG. 26 illustrates a top plan view of a touch sensor unit on which a touch driver is compressed in a process for manufacturing a display device according to an example embodiment.

Referring to FIG. 25 and FIG. 26, the method for manufacturing a display device according to an example embodiment generally corresponds to the manufacturing method according to the example embodiment described with reference to FIG. 7 to FIG. 23, and a form of the base polarizer 502 may be different.

Referring to FIG. 25, compressor holes 53 formed to correspond to the cells may not be connected to each other but may be separated from each other. The top-down width d2 of the compressor hole 53 may be greater than about 1 mm.

Referring to FIG. 26, while the touch sensor unit 400 and the polarizer 500 are bonded together for each cell, the touch driver 700 may be compressed on and connected to the touch sensor unit 400 through the compressor hole 53.

By way of summation and review, when a heavy and fragile glass substrate is used as a display panel of the display device, there is a limit in portability and display screen size thereof. Accordingly, consideration has been given to a flexible display device using a plastic substrate, which is light, strong against an impact, and flexible, as a substrate of a display panel.

Such as a display device may include a touch sensing function in which interaction with a user may be performed, in addition to a function of displaying the image. The touch sensing function may be used to find contact information such as whether an object approaches or touches a screen and a touch location thereof by sensing changes in pressure, charges, light, and the like which are applied to the screen by the display device, when the user writes text or draws figures by approaching or touching the screen using a finger or a touch pen. The display device may receive an image signal based on the contact information to display an image.

Such a touch sensing function may be implemented through a touch sensor. The touch sensor may be classified into various types such as a resistive type, a capacitive type, an electro-magnetic (EM) type, and an optical type.

The capacitive touch sensor may include a plurality of touch electrodes for transmitting a detection signal. The touch electrode may form a sensing capacitor with another touch electrode (called a mutual-capacitor type) or a sensing capacitor with a foreign object (called a self-capacitor type). When a conductor such as a finger approaches the touch sensor or contacts it, capacitance of the sensing capacitor or an amount of stored charges is varied, from which a contact state and a contact position may be found.

A plurality of touch electrodes may be disposed in a touch sensing area in which a contact may be sensed, and they may be connected to a plurality of signal transfer wires for transmitting the detection signal. The signal transfer wires may be provided in the touch sensing area or may be disposed in a non-sensing area that is provided around the touch sensing area. The signal transfer wires may transmit a sensing input signal to the touch electrode or may transmit a sensing output signal of the touch electrode generated by a touch to a sensing signal controller.

The touch sensor may be installed in the display device (i.e., an in-cell type) or may be directly formed on an outer side of the display device (i.e., an on-cell type), or an additional touch sensor may be attached to the display device (i.e., an add-on cell type). A flexible display device may use a method for forming a film on which a touch sensor is formed or an additional film-type touch sensor and attaching the same to the display panel (i.e., the add-on cell type).

When the touch sensor is a mutual-capacitor type touch sensor including an input touch electrode for receiving a sensing input signal and an output touch electrode for transmitting a sensing output signal, the touch sensor may be formed by forming the input touch electrode and the output touch electrode on another insulation film and bonding them. In this case, the touch sensor may include at least two sheets of films. When the touch sensor attached to the display panel includes a plurality of sheets of films, the display device is further thickened and its transmittance is deteriorated.

As described above, embodiments may reduce a thickness of a display device including an attachable touch sensor, and may increase transmittance of light transmitting through the touch sensor.

Embodiments may increase transmittance and flexibility by reducing an entire thickness of a flexible display device.

Embodiments may allow a narrow bezel and acquire design competition by reducing a peripheral non-sensing area in which no touch is sensed in a display device including a touch sensor.

Embodiments may reduce a tolerance needed to bond a touch sensor and a polarizer and reduce a peripheral area of a display panel to narrow a bezel.

According to an example embodiment, the thickness of the display device including an attachable touch sensor is reduced, transmittance of the light passing through the touch sensor is increased, and the entire thickness of the flexible display device is reduced to increase transmittance and flexibility.

In the display device including a touch sensor, the peripheral non-sensing area in which the touch is not sensed may be reduced. Further, the tolerance is reduced when the display panel and the touch sensor are bonded, the peripheral area of the display panel is reduced so the bezel of the display device may be reduced and design competition may be obtained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel including a plurality of pixels;
a touch sensor unit provided on the display panel, and including a touch sensing area in which a touch sensor is provided; and
a polarizer provided on the touch sensor unit,
wherein
the touch sensor unit includes a first portion having a first edge and a second portion having a second edge in a plan view, the first edge being connected to the second edge in the plan view,
the first portion overlaps the polarizer, and the first edge of the first portion is aligned with a third edge of the polarizer in the plan view, and
the second portion does not overlap the polarizer, and the second edge of the second portion is not aligned with a fourth edge of the polarizer in the plan view.

2. The display device as claimed in claim 1, wherein an area of the second portion of the touch sensor unit is defined by the second edge of the second portion and the fourth edge of the polarizer in the plan view.

3. The display device as claimed in claim 1, wherein:
the touch sensor unit includes a touch wire connected to the touch sensor, and
the touch wire includes an end portion disposed at the second portion of the touch sensor unit that does not overlap the polarizer.

4. The display device as claimed in claim 3, further comprising a printed circuit film connected to the second portion of the touch sensor unit that does not overlap the polarizer.

5. The display device as claimed in claim 4, wherein the printed circuit film includes a touch driver connected to the touch sensor unit.

6. The display device as claimed in claim 4, wherein an edge of the printed circuit film is spaced apart from the fourth edge of the polarizer.

7. The display device as claimed in claim 1, wherein at least a portion of the fourth edge of the polarizer is parallel to the second edge of the second portion of the touch sensor unit in the plan view.

8. The display device as claimed in claim 1, further comprising:
a cover window provided on the polarizer,
wherein an edge of the cover window is outside the third and fourth edges of the polarizer, and the cover window covers third and fourth edges of the polarizer.

9. The display device as claimed in claim 8, wherein:
the touch sensor unit further includes a non-sensing area around the touch sensing area,
the cover window includes a light blocking member covering at least a portion of the non-sensing area, and
the light blocking member covers a lateral side of the display panel.

10. The display device as claimed in claim 1, wherein the polarizer includes a circular polarizer.

11. The display device as claimed in claim 1, wherein:
a plurality of touch electrodes are provided in the touch sensing area, and
the plurality of touch electrodes is disposed between a touch substrate and the polarizer or between the touch substrate and the display panel.

* * * * *